US006225929B1

United States Patent
Beck (10) Patent No.: US 6,225,929 B1
(45) Date of Patent: May 1, 2001

(54) DIGITAL-TO-ANALOG CONVERTER HAVING SWITCHABLE CURRENT SOURCES AND RESISTOR STRING

(75) Inventor: Jeffery S. Beck, Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/204,817

(22) Filed: Dec. 2, 1998

(51) Int. Cl.$^7$ .................................................. H03M 1/66
(52) U.S. Cl. ............................................................. 341/144
(58) Field of Search ...................................... 341/144, 154

(56) References Cited

U.S. PATENT DOCUMENTS

| | | | |
|---|---|---|---|
| 3,699,568 | * 10/1972 | Thompson et al. | 341/154 |
| 4,873,525 | 10/1989 | Iida | 341/145 |
| 4,896,157 | 1/1990 | Mijuskovic et al. | 341/144 |
| 5,019,820 | 5/1991 | Matsuzawa et al. | 341/156 |
| 5,070,331 | 12/1991 | Hisano | 341/154 |
| 5,243,347 | * 9/1993 | Jackson et al. | 341/144 |
| 5,254,994 | 10/1993 | Takakura et al. | 341/153 |
| 5,283,580 | 2/1994 | Brooks et al. | 341/145 |
| 5,598,095 | 1/1997 | Schnaitter | 323/315 |
| 5,604,501 | 2/1997 | McPartland | 341/144 |
| 5,619,203 | 4/1997 | Gross, Jr. et al. | 341/144 |
| 5,633,637 | 5/1997 | Noro | 341/144 |
| 5,638,011 | 6/1997 | Nguyen | 327/103 |
| 5,668,550 | * 9/1997 | Coleman, Jr. | 341/119 |
| 5,781,205 | * 7/1998 | Silverbrook | 347/17 |
| 5,870,049 | * 2/1999 | Huang et al. | 341/144 |

OTHER PUBLICATIONS

Geiger, Allen & Strader, VLSI Design Techniques For Analog & Digital Circuits, McGraw Hill Inc.; 1990; pp. 623–629. ISBN: 0-07-023253-9.

* cited by examiner

Primary Examiner—Brian Young (57) ABSTRACT

A digital-to-analog converter (DAC) converts a digital input signal having N bits to a substantially equivalent analog voltage output signal. A resistor string includes N resistors serially coupled between a ground node and the analog voltage output signal. Nodes 1 through (N−1) are defined at junctions between the N resistors and a node N is coupled to the analog voltage output signal. Each of N switchable current sources is controlled by a corresponding one of the N bits of the digital input signal to supply current to a corresponding one of the N nodes when its corresponding one of the N bits is in the first state and to not supply current to its corresponding one of the N nodes when its corresponding one of the N bits is in the second state.

22 Claims, 5 Drawing Sheets

DIGITAL-TO-ANALOG CONVERTER HAVING SWITCHABLE CURRENT SOURCES AND RESISTOR STRING

THE FIELD OF THE INVENTION

The present invention generally relates to data conversion, and more particularly to digital-to-analog converters for high speed data applications in integrated circuits.

BACKGROUND OF THE INVENTION

A digital-to-analog converter (DAC) converts a digital input signal having N bits to a substantially equivalent analog output signal. Typically, the analog output signal is a voltage signal. There are a number of types of DACs which use a variety of known techniques for converting the digital input signal into an analog voltage output signal. Example types of DACs include charge-scaling DACs, current-scaling DACs, and voltage-scaling DACs. The current-scaling and voltage-scaling DACs are referred to as static designs, while the charge-scaling design is a dynamic design.

In a typical charge-scaling DACs, digital input signal bits control the charging of individual capacitors in a capacitor array to produce an analog voltage output signal, which is based on the total charge of the capacitor array. Typically, the charge-scaling DAC operates by discharging all capacitors in the array during a first clock period. During a non-overlapping second clock period, the capacitors in the capacitor array associated with digital input signal bits at a logic 1 level are connected to a reference voltage, and the capacitors in the capacitor array associated with digital input signal bits at a logic 0 level are connected to ground. The amount of charge from the charged capacitors in the capacitor array associated with digital input signal bits at a logic 1 level is used to obtain the analog voltage output signal.

In one type of current-scaling DAC, a reference voltage is converted into binary-weighted currents. For example, in one such current-scaling DAC, switches couple each input of parallel coupled binary weighted resistors to either a reference voltage or ground depending on if a digital input signal bit is a logic 1 level or a logic 0 level. The outputs of each of the binary weighted resistors are coupled to an output current node. The output current on the output current node is converted to an analog voltage output signal with an operational amplifier.

Another example of a current-scaling DAC employs an R-2R ladder coupled to a reference voltage. Switches are coupled in parallel to outputs of the R-2R resistor ladder. The switches are controlled by digital input signal bits to couple the current from the outputs of the R-2R resistor ladder to ground when the digital input signal bit is at a logic 0 level or to a current output node when the digital input signal bit is at a logic 1 level. The current output on the current output node is converted to an analog voltage output signal with an operational amplifier.

One disadvantage of the current-scaling DAC design is that an additional current-to-voltage converter is required to complete a digital-to-analog conversion. The current-to-voltage converter is typically implemented with a differential operational amplifier and a feedback resistor. The differential operational amplifier has a limited speed based on a settling-time constraints and produces less accurate results due to amplifier offset.

A typical voltage-scaling DAC for converting a N bit digital input signal to a analog voltage output signal employs a series of resistors connected between a reference voltage and ground to selectively produce $2^N$ voltages between the reference voltage level and the ground voltage level. The resistor string of the voltage-scaling DAC requires at least $2^N$ resistor segments to convert N digital input signal bits. The resistor segments of the resistor string can all be equal values or maybe partial values depending on DAC requirements. The analog voltage output signal is obtained by utilizing at least $2*2^N$ switches formed in a multiplexer network and controlled by the N digital input signal bits to select one of the $2^N$ voltages produced by the resistor string having the $2^N$ resistors between ground and the reference voltage. Although there is no requirement to convert a current to a voltage, a voltage-scaling DAC typically utilizes an operational amplifier to buffer the resistor string from the analog voltage output signal.

The voltage-scaling DAC typically requires that the voltage output of a precision reference is dynamically switched which results in settling-time and accuracy problems. In addition, the at least $2^N$ resistors and $2*2^N$ switches needed to produce the analog voltage output, occupy a significant area of an integrated circuited incorporating such a voltage-scaling DAC. Moreover, the output impedience of the voltage-scaling DAC is high and difficult to control unless an operational amplifier is used to buffer the output of the resistor string and multiplexer switching network from the analog voltage output signal. If such a operational amplifier is used, the operational amplifier has a limited speed based on a settling-time constraints and produces less accurate results due to amplifier offset.

For reasons stated above and for other reasons presented in greater detail in the Description of the Preferred Embodiments section of the present specification, a static DAC design is desired which produces more accurate results in high speed applications. In addition, there is a need for a static DAC design which occupies a minimal area of an integrated circuit incorporating the DAC design.

SUMMARY OF THE INVENTION

The present invention provides a digital-to-analog converter (DAC) and a method for converting a digital input signal having N bits to a substantially equivalent analog voltage output signal. Each bit has a first state and a second state. A resistor string includes N resistors serially coupled between a ground node and the analog voltage output signal and includes N nodes (node 1–node N). Nodes 1 through (N−1) are defined at junctions between the N resistors and node N is coupled to the analog voltage output signal. Each of N switchable current sources provides a current output coupled to a corresponding one of the N nodes of the resistor string. A control gate in each switchable current source receives a corresponding one of the N bits of the digital input signal for controlling each switchable current source to supply current to its corresponding one of the N nodes when its corresponding one of the N bits is in the first state and to not supply current to its corresponding one of the N nodes when its corresponding one of the N bits is in the second state.

In one embodiment, the digital input signal includes M bits in addition to the N bits, wherein each of the M bits has a first state and a second state. The M bits along with the Nth bit, bits N–(N+M), together represent a binary value. In this embodiment, the DAC includes thermometer converting logic for converting bits N–(N+M) into $2^{M+1}-1$ thermometer code bits representing a thermometer code of the binary value of bits N–(N+M). Each of the $2^{M+1}-1$ thermometer code bits has a first state and a second state. Each of $2^{M+1}-1$ switchable current sources provides a current output coupled to node N of the resistor string and includes a control gate for receiving a corresponding one of the $2^{M+1}-1$ thermometer code bits for controlling each switchable current source to supply current to node N when its corresponding one of the $2^{M+1}-1$ thermometer code bits is in the first state and to not supply current to node N when its corresponding one of the $2^{M+1}-1$ thermometer code bits is in the second state.

In one embodiment, the N current outputs from the N switchable current sources are substantially the same. In one such embodiment, a reference current generator provides a reference current. A control circuit receives a reference voltage and controls the reference current based on the reference voltage. Each switchable current source mirrors the reference current such that each current output is substantially equal to the reference current.

One embodiment of the reference current generator includes a transistor having a gate, source, and drain. The reference current flows through the drain and the source. A resistor element is coupled between the source of the transistor and ground. A voltage comparator includes a first input coupled to the reference voltage and a second input coupled to the source of the transistor and providing a comparison signal representative of the difference between the reference voltage and the voltage across the resistor element to the gate of the transistor. The resistor element of the reference current generator preferably comprises substantially the same type of material as the N resistors of the resistor string.

In one embodiment, each switchable current source includes first, second, and third transistors. The first transistor includes a source coupled to a power source, a drain, and a gate coupled to a first bias voltage. The second transistor includes a source coupled to the drain of the first transistor, a drain providing the current output, and a gate coupled to a second bias voltage. The third transistor includes a source coupled to ground, a drain coupled the drain of the first transistor, and the control gate receiving the corresponding one of the N bits of the digital input signal. In an alternative embodiment, the second bias voltage is coupled to the corresponding one of the N bits of the digital input signal.

In one embodiment, the N resistors have binary-weighted resistance values.

One application of the DAC according to the present invention is a analog-to-digital converter (ADC) for converting an analog voltage input signal to a substantially equivalent digital output signal having N bits. The ADC includes conversion circuitry, such as a counter or successive approximation register (SAR), for providing the digital output signal. The DAC converts the digital output signal to a substantially equivalent analog voltage comparison signal. A comparator compares the analog voltage input signal to the analog voltage comparison signal to provide a control signal for controlling the conversion circuitry.

One application of the above ADC, which incorporates the DAC according to the present invention, is in an ink-jet print head of an ink-jet printing system. For example, the analog voltage input signal could be provided by a temperature sensor as a representation of temperature of the ink-jet print head.

The DAC according to the present invention is a static design which provides accurate results in high speed applications. Moreover, the static DAC design according to the present invention occupies a minimal area of an integrated circuit incorporating the DAC design.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
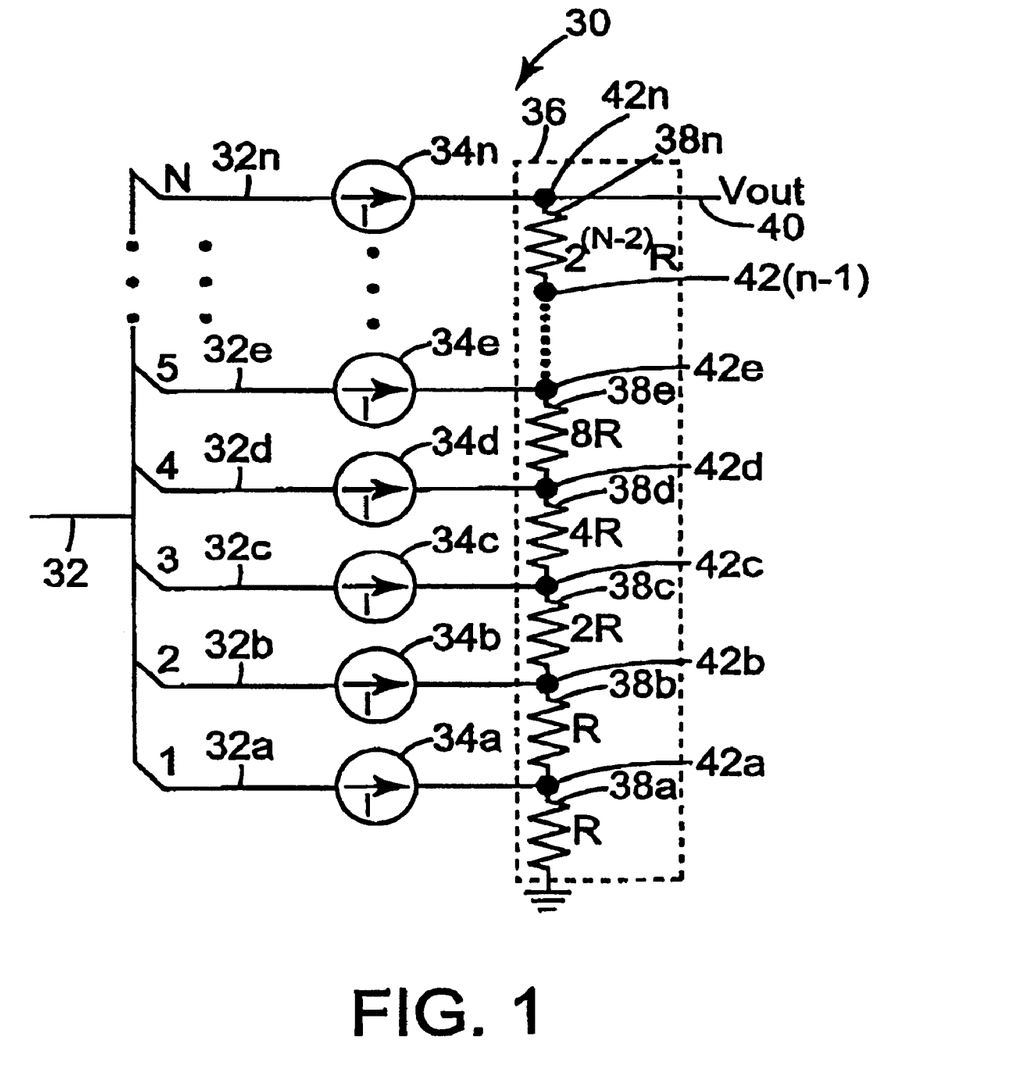
FIG. 1 is a schematic diagram of a digital-to-analog converter (DAC) according to the present invention.

A digital-to-analog converter (DAC) according to the present invention is illustrated generally at 30 in FIG. 1 in schematic diagram form. DAC 30 receives a digital input signal on a line 32. The digital input signal on line 32 includes N bits (1–N), each of which have a first state and second state. Digital input signal bits 1–N are provided respectively on individual bit lines 32a–32n to N switchable current sources 34a–34n. A resistor string 36 includes N resistors 38a–38n serially coupled between a ground node and an analog voltage output signal on a line 40. The analog voltage output signal on line 40 has a voltage value indicated as $V_{out}$. Resistor string 36 includes N nodes 42a–42n. Nodes 42a–42(n−1) are defined respectively at junctions between resistors 38a–38n. Node 42n is coupled to the analog voltage output signal on line 40.

Switchable current sources 34a–34n each provide a current output coupled respectively to nodes 42a–42n. Each switchable current source 34a–34n receives a corresponding one of the N bits of the digital input signal on lines 32a–32n respectively for controlling the current output from each switchable current source 34a–34n. Each current source 34a–34n supplies current to its corresponding one of nodes 42a–42n when its corresponding one of digital input signal bits 32a–32n is in the first state and does not supply current to its corresponding one of nodes 42a–42n when its corresponding one of digital input signal bits 32a–32n is in the second state. For example, in one embodiment of switchable current source 34, which is described in more detail below with reference to FIG. 2, the first state of the digital input signal bits is a logic 0 level (e.g., ground level) and the second state of the digital input signal bits is a logic 1 level (e.g., approximately 2 to 5 volt level).

In one embodiment, switchable current sources 34a–34n provide substantially an equal amount of current from each current source (i.e., one unit of current), referred to herein as I amps. In one embodiment, resistors 38a–38n of resistor string 136 have binary-weighted resistance values. For example, resistor 38a has a resistance value of R ohms (i.e., one unit of resistance). Resistor 38b has a resistance value of R ohms. Resistor 38c has a resistance value of 2R ohms. Resistor 38d has a resistance value of 4R ohms. Resistor 38e has a resistance value of 8R ohms. Following this binary-weighted resistance value pattern, resistor 38n has a resistance value of $2^{(N-2)}$ R ohms. In this embodiment of DAC 30, the voltage value ($V_{out}$) of the analog voltage output signal on line 40 is given by the following Equation I:

$$V_{out} = R \sum_{n=1}^{N} 2^{n-1} I_n \quad \text{Equation I}$$

In the embodiment where switchable current sources 34a–34n provide substantially the same amount of current (i.e., I amps) from each current source, the $I_n$ value of Equation I is I amps for each value from n=1 to n=N. For example, with I amps being provided from each switchable current source 34, according to Equation I, if no switchable current source 34 is on, $V_{out}$ on line 40 is at a ground level. If only switchable current source 34a is on, $V_{out}$ on line 40 is RI. If only switchable current sources 34a and 34b are on, $V_{out}$ on line 40 is RI+2RI=3RI. If only switchable current source 34n is on, $V_{out}$ on line 40 is $2^{N-1}$RI. If all switchable current sources 34a–34n are switched on, $V_{out}$ on line 40 is $(2^N-1)$RI.

Figure 2:
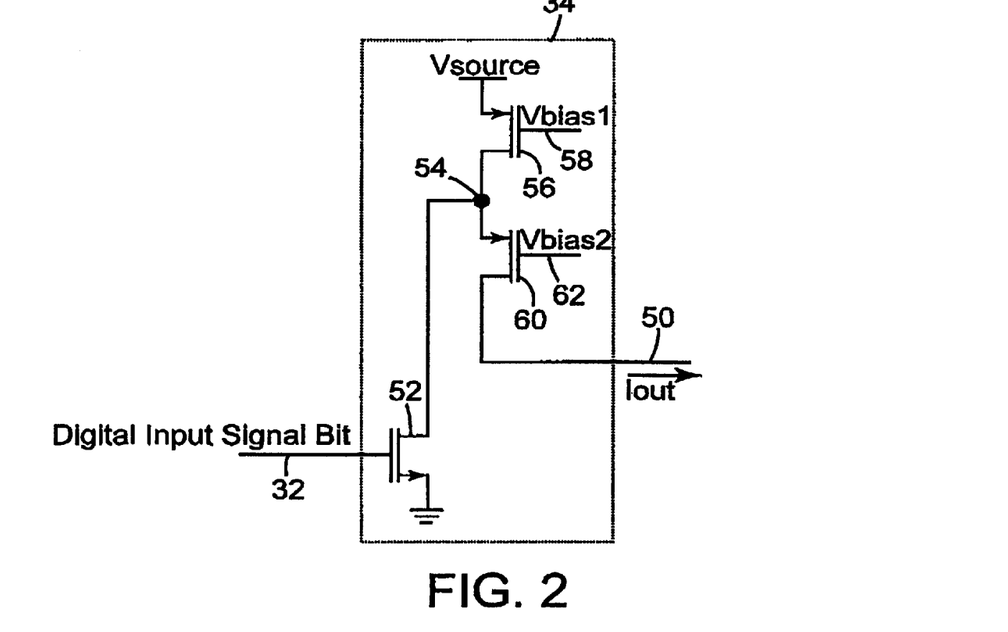
FIG. 2 is a schematic diagram of a switchable current source employed in the DAC of FIG. 1.

FIG. 2 illustrates, in schematic diagram form, one embodiment of a switchable current source 34 according to the present invention. Switchable current source 34 receives a digital input signal bit on line 32 and provides a current output ($I_{out}$) on a line 50. Switchable current source 34 includes an N-channel transistor 52 having a control gate coupled to the digital input signal bit on line 32. N-channel transistor 52 includes a source coupled to ground and a drain coupled to a node 54. A P-channel transistor 56 includes a gate coupled to a first bias voltage ($V_{bias1}$) on a line 58. P-channel transistor 56 includes a source coupled to a voltage source ($V_{source}$) and a drain coupled to node 54. A P-channel transistor 60 includes a gate coupled to a second bias voltage ($V_{bias2}$) on a line 62. P-channel transistor 60 includes a source coupled to node 54 and a drain coupled to the current output ($I_{out}$) on line 50.

In operation, the state of the digital input signal bit on line 32 determines if N-channel transistor 52 is on or off. In one embodiment, the first state of the digital input signal bit is a logic 0 level (e.g., ground level) and the second state of the digital input signal bit is a logic 1 level (e.g., 2 to 5 volt level). When the digital input signal bit on line 32 is a logic 1 level, N-channel transistor 52 is on, to thereby draw current from $V_{source}$ through P-channel transistor 56 through node 54 through N-channel transistor 52 to ground. When the digital input signal bit on line 32 is a logic 0 level, N-channel transistor 52 is off, and current flows from $V_{source}$ through P-channel transistor 56 and flows from node 54 through P-channel transistor 60 to produce a current ($I_{out}$) on line 50. Thus, when the digital input signal bit on line 32 is a logic 1 level, no current is provided on line 50, and when the digital input signal bit on line 32 is a logic 0 level, one unit of current ($I_{out}$) is provided on line 50. The amount of current $I_{out}$ provided on line 50 is a function of the value of $V_{bias1}$ on line 58, which controls the gate of P-channel transistor 56 to thereby control the amount of current drawn from $V_{source}$ through P-channel transistor 56 to node 54.

The design of switchable current source 34 as described above is referred to as a cascode current source design. In a first embodiment of cascode switchable current source 34, the second bias voltage ($V_{bias2}$) is tied to the digital input signal bit on line 32. In this embodiment, the gates of N-channel transistor 52 and P-channel transistor 60 are coupled to the same control bit (i.e., the digital input signal bit on line 32). As a result, in this embodiment, P-channel transistor 60 is off when N-channel transistor 52 is on and P-channel transistor 60 is on when N-channel transistor 52 is off. In this embodiment, node 54 is completely isolated from line 50 by switching off P-channel transistor 60 when N-channel transistor 52 is on.

In an alternative embodiment of cascode switchable current source 34, $V_{bias2}$ is not tied to the digital input signal bit on line 32, but is an independent bias voltage that isolates node 54 from output line 50 when N-channel transistor 52 is on and current is flowing from node 54 through N-channel transistor 52 to ground. In this alternative embodiment, when N-channel transistor 52 is off, the bias voltage $V_{bias2}$ on line 62 is at a value which permits current to flow from node 54 to output line 50. One advantage of this embodiment of switchable current source 34 illustrated in FIG. 2 is that the voltage source ($V_{source}$) is independent of the level of the logic signal provided on the gate of N-channel transistor 52. For example, in one embodiment, the level of the digital signal on line 32 is approximately 2 to 5 volts, and the $V_{source}$ is equal to approximately 12 volts.

Figure 3:
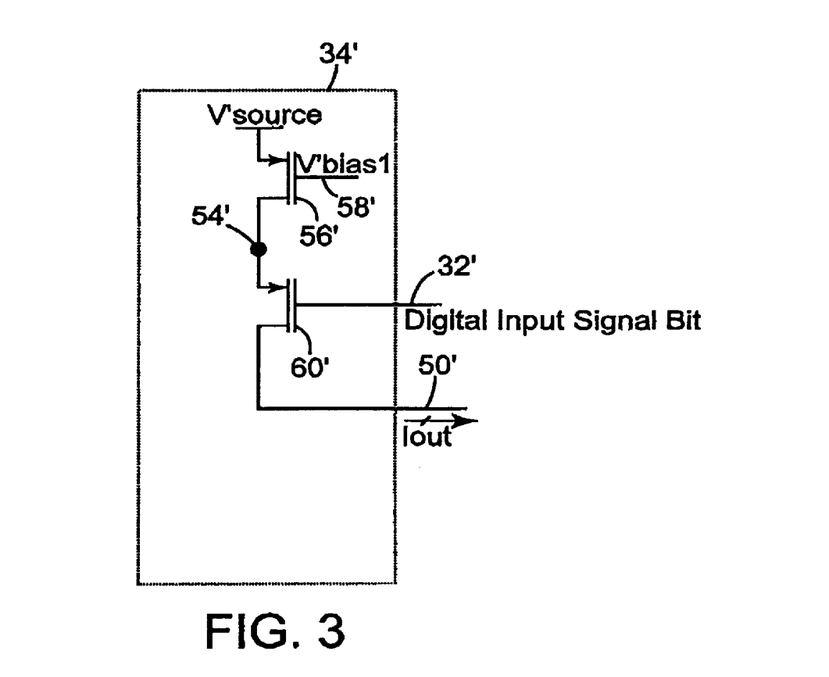
FIG. 3 is a schematic diagram of an alternative embodiment of a switchable current source employed in the DAC of FIG. 1.

An alternative embodiment of a switchable current source suitable for replacing switchable current source 34 in DAC 30 is illustrated in schematic diagram form at 34' in FIG. 3. Switchable current source 34' receives a digital input signal bit on a line 32' and provides a current output ($I'_{out}$) on a line 50'. A P-channel transistor 56' includes a gate coupled to a first bias voltage ($V'_{bias1}$) on a line 58'. P-channel transistor 56' includes a source coupled to a voltage source ($V'_{source}$) and a drain coupled to a node 54'. A P-channel transistor 60' includes a gate coupled to the digital input signal bit on line 32'. P-channel transistor 60' includes a source coupled to node 54' and a drain coupled to the current output ($I'_{out}$) on line 50'.

In operation, the state of the digital input signal bit on line 32' determines if P-channel transistor 60' is on or off. When the digital input signal bit on line 32' is a logic 1 level, P-channel transistor 60' is off. As a result of current being prevented from flowing from through P-channel transistor 60', no current is produced on line 50'. When the digital input bit on line 32' is a logic 0 level, P-channel transistor 60' is on, and current flows from $V'_{source}$ through P-channel transistor 56' and flows from node 54' through P-channel transistor 60' to produce a current ($I'_{out}$) on line 50'. Thus, when the digital input signal bit on line 32' is a logic 1 level, no current is provided on line 50', and when the digital input signal bit on line 32' is a logic 0 level, one unit of current ($I'_{out}$) is provided on line 50'. The amount of current $I'_{out}$ provided on line 50' is a function of the value Of $V'_{bias1}$ one line 58', which controls the gate of P-channel transistor 56' to thereby control the amount of current drawn from $V'_{source}$ through P-channel transistor 56' to node 54'.

For a DAC 30 operating at higher speeds, the current steering design of switchable current source 34 of FIG. 2 provides advantages over the blocking/shorting design of switchable current source 34' of FIG. 3. In the current steering design of switchable current source 34 of FIG. 2, current is always flowing from $V_{source}$ through the current source circuit (i.e., either through N-channel transistor 52 to ground or through P-channel transducer 60 to output line 50). By contrast, the switchable current source 34' of FIG. 3 blocks current from flowing from $V'_{source}$ when no current is provided on output line 50'. Consequently, switchable current source 34' produces current spikes at higher speeds on output line 50' caused by the fast switching between no current flowing from power source $V'_{source}$ and the current output ($I'_{out}$) flowing from power source $V'_{source}$ to line 50'. Therefore, with a constant current flowing from power source $V_{source}$ through switchable current source 34, DAC 30 produces more accurate results at higher speeds than are produced with a DAC 30 employing switchable current source 34'. However, switchable current source 34 consumes more power than switchable current source 34' because current is always flowing from $V_{source}$ through switchable current source 34.

Figure 4:
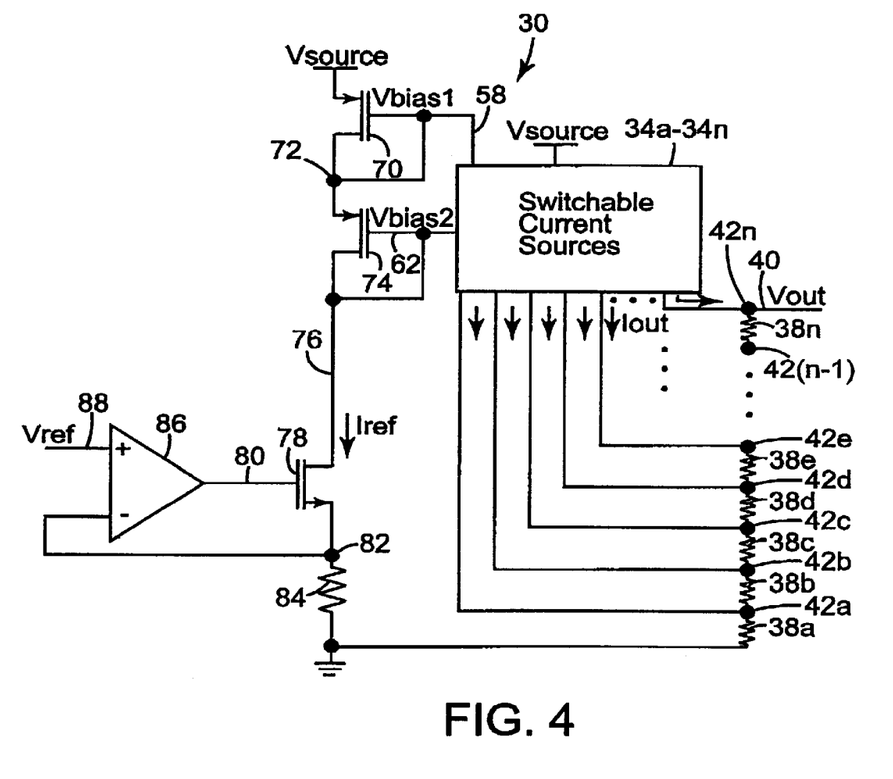
FIG. 4 is a block and schematic diagram illustrating a portion of the DAC of FIG. 1 related to generating a reference current to be mirrored by switchable current sources.

FIG. 4 illustrates a portion of DAC 30 related to generating a reference current ($I_{ref}$), which is mirrored by switchable current sources 34a–34n so that each provide a current output $I_{out}$ which is substantially identical to reference current $I_{ref}$. A P-channel transistor 70 includes a gate coupled to the first bias voltage ($V_{bias\ 1}$) on line 58 and to a node 72. P-channel transistor 70 includes a source coupled to voltage source ($V_{source}$) and a drain coupled to node 72. A P-channel transistor 74 includes a gate coupled to the second bias voltage ($V_{bias\ 2}$) on line 62 and to a line 76. P-channel transistor 74 includes a source coupled to node 72 and a drain coupled to the reference current ($I_{ref}$) provided on line 76.

An N-channel transistor 78 includes a gate which receives a voltage comparison signal on a line 80. N-channel transistor 78 includes a source coupled to a node 82 and a drain coupled to the reference current $I_{ref}$ on line 76. A resistor element 84 is coupled between node 82 and ground. A voltage comparator circuit 86, such as an operational amplifier, includes a–input coupled to node 82 to receive the voltage at node 82 (i.e., the voltage across resistor element 84). Voltage comparator circuit 86 includes a+input coupled to receive a reference voltage ($V_{ref}$) on a line 88. Voltage comparator circuit 86 compares the reference voltage $V_{ref}$ on line 88 with the voltage across resistor element 84 to provide the voltage comparison signal on line 80, which represents the difference between $V_{ref}$ and the voltage across resistor element 84.

In operation, the voltage comparison signal on line 80 controls the gate of N-channel transistor 78 to control the amount of current ($I_{ref}$) flowing through N-channel transistor 78. The current ($I_{ref}$) flowing through N-channel transistor 78 flows through resistor element 84 and produces a voltage drop across resistor element 84 equal to (the reference current $I_{ref}$)*(the resistance value of resistor element 84). The voltage drop across resistor element 84 is compared to the reference voltage $V_{ref}$ to produce the voltage comparison signal on line 80 used for controlling the amount of current ($I_{ref}$). In this way, the reference voltage $V_{ref}$ on line 88 is employed to control the amount of reference current $I_{ref}$.

In addition, P-channel transistor 70 is substantially similar to P-channel transistor 56 (shown in FIG. 2) and P-channel transistor 74 is substantially similar to P-channel transistor 60 (shown in FIG. 2). The bias voltages $V_{bias1}$ on line 58 and $V_{bias2}$ on line 62 are representative of the current $I_{ref}$ on line 76 and are provided respectively to the gates of P-channel transistors 56 and 60 to control the current $I_{out}$ provided on line 50 from cascode current source 34 comprising P-channel transistors 56 and 60. In this way, the current $I_{out}$ on line 50 mirrors the reference current $I_{ref}$ on line 76, which in turn is controlled by the reference voltage $V_{ref}$ on line 88.

In one embodiment, resistor element 84 preferably comprises the same type of material as resistors 38 of resistor string 36. In this way, the thermal coefficient related variations in resistors 38 are canceled by the same thermal coefficient related variations of resistor element 84. This is because the analog voltage output signal on line 40 is given by an IR value, where I is one or more units of $I_{out}$ and $I_{out}$ is substantially equal to $I_{ref}$, which is controlled by comparing the voltage across resistor element 84 with the reference voltage $V_{ref}$ on line 88.

Figure 5:
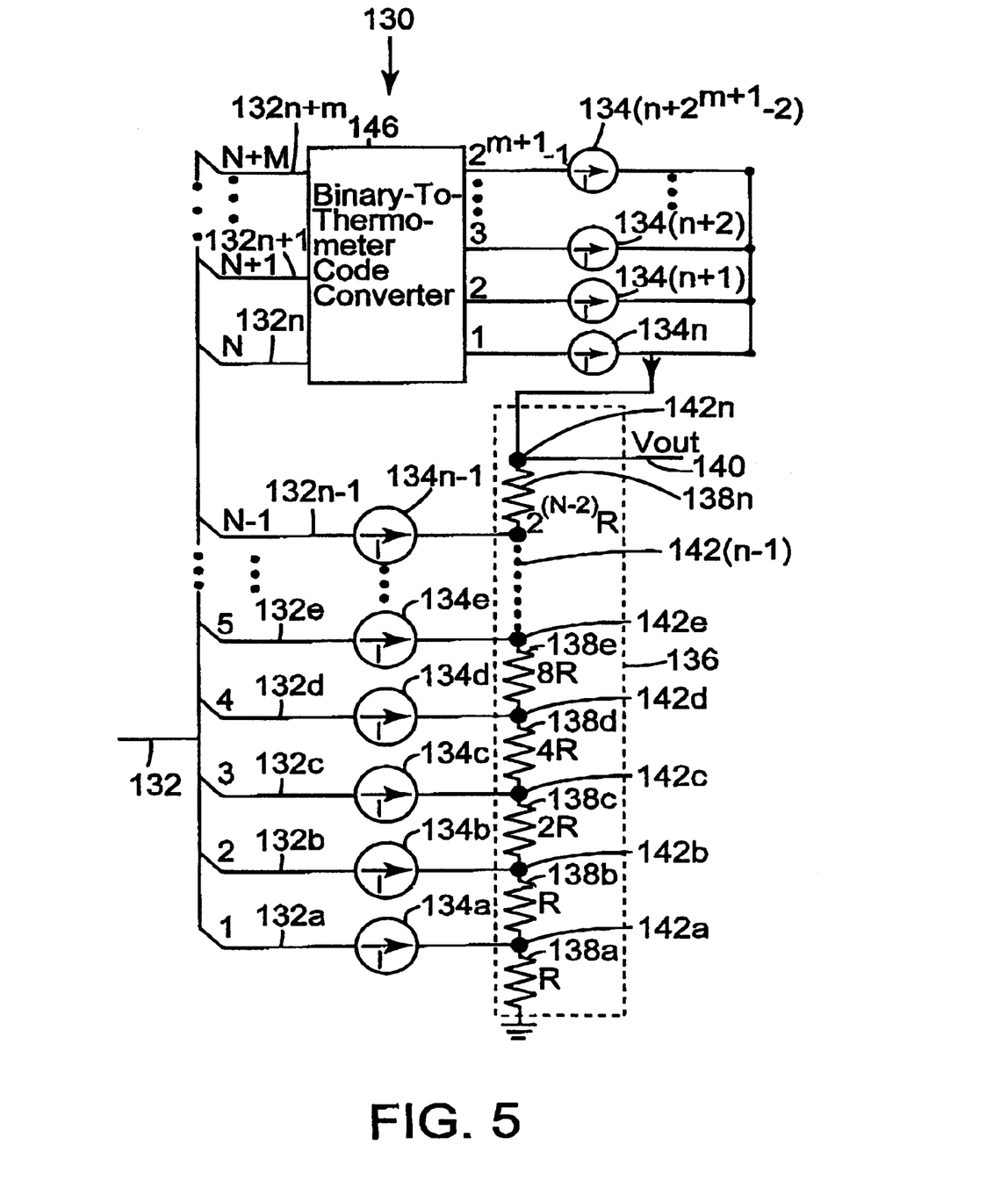
FIG. 5 is a schematic and block diagram illustrating an alternative embodiment of a DAC according to the present invention which incorporates a binary-to-thermometer code converter.

An alternative embodiment of a DAC according to the present invention is illustrated generally at 130 in FIG. 5. DAC 130 receives a digital input signal on a line 132. The digital input signal on line 132 includes N+M bits (1 through (N+M)), each of which have a first state and a second state. Digital input signal bits 1–(N–1) are provided respectfully on individual bit lines 132a–132n–1 to N switchable current sources 134a–134n–1. Digital input signal bits N–(N+M) are provided respectively on individual bit lines 132n–132n+m to a binary-to-thermometer code converter 146. Binary-to-thermometer code converter 146 performs a conventional binary-to-thermometer code conversion on binary digital input signal bits N–N+M on lines 132n–132n+m to produce $2^{m+1}-1$ digital output signal bits 1–($2^{m+1}-1$) which are provided respectively to switchable current sources 134n–134(n+$2^{m+1}-2$). An example of a binary-to-thermometer code conversion is provided in the following Table I for a three bit binary input and a seven bit thermometer code output.

TABLE I

| Binary Input | Thermometer Output |
|---|---|
| 000 | 0000000 |
| 001 | 0000001 |
| 010 | 0000011 |
| 011 | 0000111 |
| 100 | 0001111 |
| 101 | 0011111 |
| 110 | 0111111 |
| 111 | 1111111 |

A resistor string 136 includes N resistors 138a–138n serially coupled between a ground node and an analog voltage output signal on a line 140. The analog voltage output signal on line 140 has a voltage value indicated as $V_{out}$. Resistor string 136 includes N nodes 142a–142n. Nodes 142a–142(n–1) are defined respectively at junctions between resistors 138a–138n. Node 142n is coupled to the analog voltage Switchable current sources 134a–134n–1 each provide a current output coupled respectfully to nodes 142a–142n–1. Each switchable current source 134a–134n–1 receives a corresponding one of the N–1 bits of the digital input signal on lines 132a–132n–1 respectively for controlling the current output from each switchable current source 134a–134n–1. Each current source 134a–134n–1 supplies current to its corresponding one of nodes 142a–142n–1 when its corresponding one of digital input single bits 132a–132n–1 is in the first state and does not supply current to its corresponding one of nodes 142a–142n–1 when its corresponding one of digital input single bits 132a–132n–1 is in the second state.

Switchable current sources $134n$–$134(n+2^{m+1}-2)$ each provide a current output coupled to node $142n$. Each switchable current source $134n$–$134(n+2^{m+1}-2)$ receives a corresponding one of the thermometer code output bits $1$–$(2^{m+1}-1)$ for controlling current output from each switchable current source $134n$–$134(n+2^{m+1}-2)$. Each current source $134n$–$134(n+2^{m+1}-2)$ supplies current to node $142n$ when its corresponding one of thermometer code output bits $1$–$(2^{m+1}-1)$ is in the first state and does not supply current to node $142n$ when its corresponding one of thermometer code output bits $1$–$(2^{m+1}-1)$ is in the second state.

In one embodiment, each switchable current source $134a$–$134(n+2^{m+1}-2)$ provides substantially equal amounts of current (i.e., one unit of current), referred to herein as I amps. In one embodiment, resistors $138a$–$138n$ of resistor string 136 have binary-weighted resistance values. For example, resistor $138a$ has a resistance value of R ohms (i.e., one unit of resistance). Resistor $138b$ has a resistance value of R ohms. Resistor $138c$ has a resistance value of 2R ohms. Resistor $138d$ has a resistance value of 4R ohms. Resistor $138e$ has a resistance value of 8R ohms. Resistor $138n$ has a resistance value of $2^{(N-2)}R$ ohms. In this embodiment of DAC 130, the voltage value ($V_{out}$) of the analog voltage output signal on line 140 is given by the following Equation II:

$$V_{out} = R \sum_{n=1}^{N+M} 2^{n-1} I_n \qquad \text{Equation II}$$

Binary-to-thermometer code converter 146 extends the range of DAC 130 without adding resistors to resistor string 136. However, binary-to-thermometer code converter 146 adds additional current sources instead of adding resistors to resistor string 136. There is a one to one correspondence between the N−1 least significant bits of the digital input signal on line 132 and the number of current sources $134a$–$134n$−1 and resistors $138a$–$138n$ of resistor string 136, but the resistance values of each successive resistor in the resistor string 136 increases exponentially, such that resistor $138n$ has a resistance value of $2^{(N-2)}R$. This exponential increase in resistance values eventually requires that the resistors of the resister string corresponding to the most significant of the N bits occupy substantial area of the integrated circuit incorporating DAC 130. The current sources at the output of binary-to-thermometer code converter 146 each provide equivalent amounts of current (I amps), but the number of current sources at the output of binary-to-thermometer code converter 146 increase exponentially as the M digital input bits increase because $2^{M+1}-1$ switchable current sources are employed at the output of binary-to-thermometer code converter 146. By combining resistor string 136 with binary-to-thermometer code converter 146, DAC 130 takes advantage of the low end of the exponential curve for both the number of current sources at the output of binary-to-thermometer code converter 146 and the resistance values of the resistors of resistor string 136 corresponding to the most significant of the N bits. In this way, a designer of DAC 130 can set the number of bits M and N to minimize the total area occupied by current sources $134a$–$134(n+2^{m+1}-2)$ and resistors $142a$–$142n$ of resistor string 136.

Figure 6:
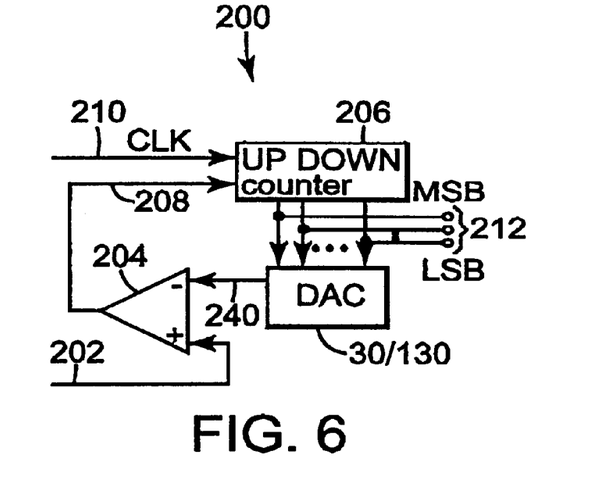
FIG. 6 is a block diagram of one embodiment of an analog-to-digital converter (ADC) which incorporates a DAC according to the present invention.

FIG. 6 is a block diagram of one embodiment of an analog-to-digital converter (ADC) 200 which incorporates a DAC 30 or DAC 130 according to the present invention. ADC 200 receives an analog voltage input signal on a line 202. A voltage comparator circuit 204 receives the analog voltage input signal on line 202 and an analog voltage comparison signal provided from DAC 30/130 on line 240. Voltage comparator 204 provides an up/down control signal to an up/down counter 206 on a line 208. A clock signal is provided to up/down counter on a line 210. Up/down counter 206 provides a digital output signal on lines 212 which is substantially equivalent to the analog voltage input signal on line 202. DAC 30/130 converts the digital output signal on lines 212 to the substantially equivalent analog voltage comparison signal on line 240.

In operation, assume that the analog voltage comparison signal provided by DAC 30/130 on line 240 is less than the analog voltage input signal on line 202. In this case, the up/down control signal on line 208 from comparator 204 causes up/down counter 206 to count up. In this way, analog voltage comparison signal increases with each clock pulse of the clock signal on line 210 until it eventually exceeds the analog voltage input signal on line 202, at which point the up/down control signal on line 208 changes state so that it causes up/down counter 206 to count down by one count. If the analog voltage input signal on line 202 stays at a constant value, then the up/down control signal on line 208 will cause up/down counter 206 to count up by one count on the next clock pulse of the clock signal on line 210.

ADC 200 which incorporates DAC 30/130 according to the present invention is one of numerous ADC designs which could employ DAC 30/130 according to the present invention. For example, up/down counter 206 functions as a conversion circuit for providing the digital output signal on lines 212. Another embodiment of an ADC according to the present invention includes a successive approximation register (SAR). Such an ADC operates in a known manner to successively sum and store weighted values into the SAR. The weighted values are compared in descending order, starting with the largest weighted value. A weighted value is not added to the summed digital data stored in the SAR if the weighted value, when added to the previous summed weighted values, produces a sum larger than the analog voltage input signal. The summed digital data is updated in the SAR and a new weighted value is converted by DAC 30/130 to a substantially equivalent analog voltage comparison signal which is compared to the analog voltage input signal on each active edge of a SAR clock. At the end of the successive approximation when balance is achieved, the sum of the weighted values stored as the summed digital data in the SAR represents the approximated value of the analog voltage input signal.

Figure 7:
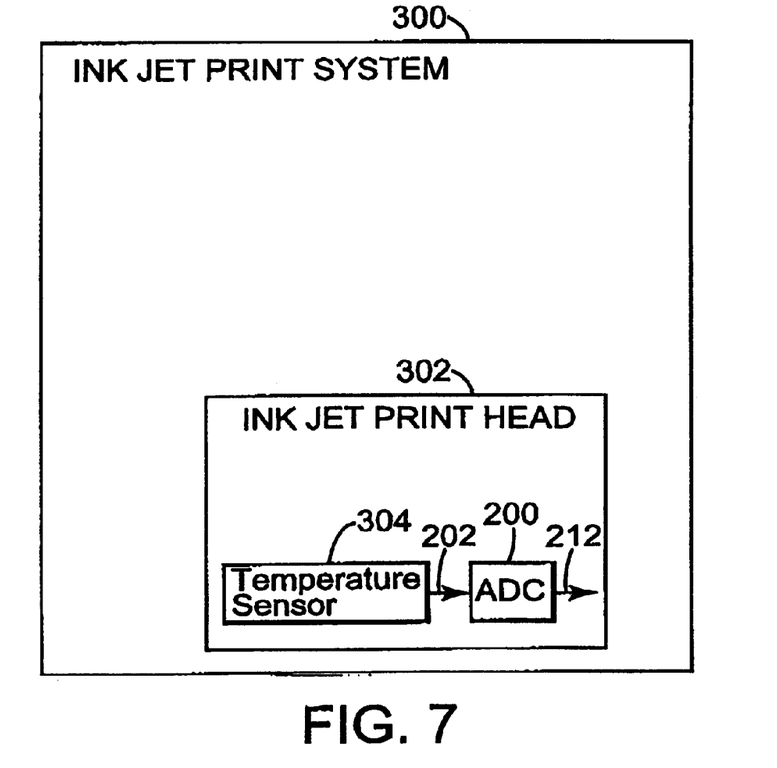
FIG. 7 is a block diagram illustrating an ink-jet printing system which incorporates the ADC of FIG. 6 which incorporates a DAC according to the present invention.

FIG. 7 illustrates in block diagram form an ink-jet printing system 300 which incorporates ADC 200 of FIG. 6 which incorporates DAC 30/130 according to the present invention. Ink-jet printing system 300 includes an ink-jet print head 302. Ink-jet print head 302 includes a temperature sensor 304 for sensing temperature in the ink-jet print head. Temperature sensor 304 provides an analog voltage input signal representative of the sensed temperature in the ink-jet print head 302 on line 202 to ADC 200. ADC 200 converts the analog temperature signal on line 202 to a substantially equivalent digital signal on line 212. The ink-jet printing system 300 represents one of numerous applications for ADC 200 according to the present invention where an analog signal is sensed and is required to be converted to a digital value.

DAC 30/130 according to the present invention can be employed in numerous high precision and high speed applications where a digital input signal needs to be converted to a substantially equivalent analog output signal. DAC 30/130 produces accurate results at high speeds and is a static DAC design which occupies a minimal area of an integrated circuit incorporating DAC 30/130. DAC 30/130 does not have a switched reference voltage, such as a conventional R-2R ladder current-scaling DAC. In addition, DAC 30/130 does not require an output operational amplifier and its corresponding feedback resistor. Moreover, DAC 30/130 has a controlled output impedance. When the reference current ($I_{ref}$) is generated and mirrored according to the portion of DAC 30 illustrated in FIG. 4, the analog voltage output from DAC 30/130 inherently tracks the input reference voltage ($V_{ref}$). Furthermore, when the embodiment of switchable current source 34 illustrated in FIG. 2 is employed in DAC 30/130, the voltage level range of the analog voltage output signal is independent of the digital input signal levels provided to the DAC.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A digital-to-analog converter (DAC) for converting a digital input signal having N bits to a substantially equivalent analog voltage output signal, the DAC comprising:
   a resistor string having N resistors serially coupled between a ground node and the analog voltage output signal and having N nodes (node 1–node N), wherein nodes 1 through (N–1) are defined at junctions between the N resistors and node N is coupled to the analog voltage output signal; and
   N switchable current sources, each switchable current source including:
      a first transistor having a source coupled to a power source, a drain, and a gate coupled to a first bias voltage;
      a second transistor having a source coupled to the drain of the first transistor, a drain providing a current output coupled to a corresponding one of the N nodes of the resistor string, and a gate; and
      a third transistor having a source coupled to ground, a drain coupled the drain of the first transistor, and a control gate receiving a corresponding one of the N bits of the digital input signal.

2. The DAC of claim 1 wherein the digital input signal includes M bits in addition to the N bits, wherein each of the N and the M bits has a first state and a second state and wherein the M bits along with the Nth bit, bits N–(N+M), together represent a binary value, and wherein the DAC further comprises:
   thermometer converting logic for converting bits N–(N+M) into $2^{M+}-1$ thermometer code bits representing a thermometer code of the binary value of bits N–(N+M), wherein each of the $2^{M+1}-1$ thermometer code bits has a first state and a second state; and
   $2^{M+1}-1$ switchable current sources, each switchable current source providing a current output coupled to node N of the resistor string and having a control gate for receiving a corresponding one of the $2^{M+1}-1$ thermometer code bits for controlling each switchable current source to supply current to node N when its corresponding one of the $2^{M+1}-1$ thermometer code bits is in the first state and to not supply current to node N when its corresponding one of the $2^{M+1}-1$ thermometer code bits is in the second state.

3. The DAC of claim 1 wherein the N current outputs from the N switchable current sources are substantially the same.

4. The DAC of claim 1 further comprising:
   a reference current generator providing a reference current;
   a control circuit receiving a reference voltage and controlling the reference current based on the reference voltage; and
   wherein each switchable current sources mirrors the reference current such that each current output is substantially equal to the reference current.

5. The DAC of claim 4 wherein the reference current generator includes:
   a transistor having a gate, source, and drain, wherein the reference current flows through the drain and the source; and
   a resistor element coupled between the source of the transistor and ground.

6. The DAC of claim 5 wherein the control circuit includes:
   voltage comparator having a first input coupled to the reference voltage and a second input coupled to the source of the transistor and providing a comparison signal representative of the difference between the reference voltage and the voltage across the resistor element to the gate of the transistor.

7. The DAC of claim 5 wherein the resistor element of the reference current generator comprises substantially the same type of material as the N resistors of the resistor string.

8. The DAC of claim 1 wherein in each switchable current source the gate of the second transistor is coupled to a second bias voltage.

9. The DAC of claim 1 wherein in each switchable current source the gate of the second transistor receives the corresponding one of the N bits of the digital input signal.

10. The DAC of claim 1 wherein the N resistors have binary-weighted resistance values.

11. An analog-to-digital converter (ADC) for converting an analog voltage input signal to a substantially equivalent digital output signal having N bits the ADC comprising:
   conversion circuitry for providing the digital output signal;
   a digital-to-analog converter (DAC) for converting the digital output signal to a substantially equivalent analog voltage comparison signal, the DAC comprising:
      a resistor string having N resistors serially coupled between a ground node and the analog voltage comparison signal and having N nodes (node 1–node N), wherein nodes 1 through (N–1) are defined at junctions between the N resistors and node N is coupled to the analog voltage comparison signal; and
      N switchable current sources, each switchable current source including:
         a first transistor having a source coupled to a power source, a drain, and a gate coupled to a first bias voltage;
         a second transistor having a source coupled to the drain of the first transistor, a drain providing a current output coupled to a corresponding one of the N nodes of the resistor string, and a gate; and
         a third transistor having a source coupled to ground, a drain coupled the drain of the first transistor, and a control gate receiving a corresponding one of the N bits of the digital input signal; and a comparator for comparing the analog voltage input signal to the analog voltage comparison signal to provide a control signal for controlling the conversion circuitry.

12. An ink-jet print head comprising:

a digital-to-analog converter (DAC) for converting a digital input signal having N bits to a substantially equivalent analog voltage output signal, the DAC comprising:

a resistor string having N resistors serially coupled between a ground node and the analog voltage output signal and having N nodes (node 1–node N), wherein nodes 1 through (N-1) are defined at junctions between the N resistors and node N is coupled to the analog voltage output signal; and N switchable current sources, each switchable current source including:

a first transistor having a source coupled to a power source, a drain, and a gate coupled to a first bias voltage;

a second transistor having a source coupled to the drain of the first transistor, a drain providing a current output coupled to a corresponding one of the N nodes of the resistor string, and a gate; and a third transistor having a source coupled to ground, a drain coupled the drain of the first transistor, and a control gate receiving a corresponding one of the N bits of the digital input signal.

13. The ink-jet print head of claim 12 further comprising:
conversion circuitry for providing the digital input signal; and a comparator for comparing an analog voltage input signal to the analog voltage output signal from the DAC to provide a control signal for controlling the conversion circuitry.

14. The ink-jet print head of claim 13 further comprising:

a temperature sensor for providing the analog voltage input signal as a representation of a temperature in the ink-jet print head.

15. An ink-jet printing system comprising:
an ink-jet print head comprising:

a digital-to-analog converter (DAC) for converting a digital input signal having N bits to a substantially equivalent analog voltage output signal, the DAC comprising:

a resistor string having N resistors serially coupled between a ground node and the analog voltage output signal and having N nodes (node 1–node N), wherein nodes 1 through (N-1) are defined at junctions between the N resistors and node N is coupled to the analog voltage output signal; and N switchable current sources, each switchable current source including:

a first transistor having a source coupled to a power source, a drain, and a gate coupled to a first bias voltage;

a second transistor having a source coupled to the drain of the first transistor, a drain providing a current output coupled to a corresponding one of the N nodes of the resistor string, and a gate; and a third transistor having a source coupled to ground, a drain coupled the drain of the first transistor, and a control gate receiving a corresponding one of the N bits of the digital input signal.

16. The ink-jet printing system of claim 15 wherein the ink-jet print head further comprises:

conversion circuitry for providing the digital input signal; and a comparator for comparing an analog voltage input signal to the analog voltage output signal from the DAC to provide a control signal for controlling the conversion circuitry.

17. The ink-jet print system of claim 16 wherein the ink-jet print head further comprises:

a temperature sensor for providing the analog voltage input signal as a representation of a temperature in the ink-jet print head.

18. A method of converting a digital input signal having N bits to a substantially equivalent analog voltage output signal, the method comprising the steps of:

defining nodes 1 through (N-1) at junctions between N resistors of a resistor string, wherein the N resistors are serially coupled between a ground node and the analog voltage output signal;

defining node N at the analog voltage output signal; and providing N switchable current outputs with N switchable current sources, each switchable current source including:

a first transistor having a source coupled to a power source, a drain, and a gate coupled to a first bias voltage;

a second transistor having a source coupled to the drain of the first transistor, a drain providing a current output coupled to a corresponding one of the N nodes of the resistor string, and a gate; and a third transistor having a source coupled to ground, a drain coupled the drain of the first transistor, and a control gate receiving a corresponding one of the N bits of the digital input signal.

19. The method of claim 18 wherein the digital input signal includes M bits in addition to the N bits, wherein each of the M bits has a first state and a second state and wherein the M bits along with the Nth bit, bits N–(N+M), together represent a binary value, and wherein the method further comprises the steps of:

converting bits N–(N+M) into $2^{M+1}-1$ thermometer code bits representing a thermometer code of the binary value of bits N–(N+M), wherein each of the $2^{M+1}-1$ thermometer code bits has a first state and a second state; and providing $2^{M+1}-1$ additional switchable current outputs, each to node N, wherein the $2^{M+1}-1$ thermometer code bits control corresponding switchable current outputs such that each of the $2^{M+1}-1$ additional switchable current outputs provide current to node N when its corresponding one of the $2^{M+1}-1$ thermometer code bits is in the first state and does not provide current to node N when its corresponding one of the $2^{M+1}-1$ thermometer code bits is in the second state.

20. The method of claim 18 wherein the N current outputs are substantially the same.

21. The method of claim 18 further comprising the steps of:

providing a reference current;

controlling the reference current based on a reference voltage; and maintaining the current outputs at substantially the same level as the reference current.

22. The method of claim 18 wherein the N resistors have binary-weighted resistance values.

* * * * *